United States Patent [19]
Amberg

[11] Patent Number: 6,142,794
[45] Date of Patent: Nov. 7, 2000

[54] LOW COST PIN RETENTION SOCKET

[75] Inventor: Mark F. Amberg, Littleton, Colo.

[73] Assignee: Lucent Technologies, Inc., Murray Hill, N.J.

[21] Appl. No.: 09/207,942

[22] Filed: Dec. 9, 1998

[51] Int. Cl.⁷ .................................................. H01R 15/10
[52] U.S. Cl. .......................................................... 439/82
[58] Field of Search .................................... 439/844, 843, 439/842, 825, 78, 82

[56] References Cited

U.S. PATENT DOCUMENTS

| | | | |
|---|---|---|---|
| 2,786,883 | 3/1957 | Zelt | 439/825 |
| 3,980,388 | 9/1976 | Nailor | 439/825 |
| 4,838,800 | 6/1989 | Lynch | 439/78 |

*Primary Examiner*—Neil Abrams
*Assistant Examiner*—Eugene G. Byrd
*Attorney, Agent, or Firm*—Duft, Graziano & Forest, PC

[57] ABSTRACT

The present low cost pin retention socket comprises a set of holes that are machined into a printed wiring board and selective surfaces thereof plated to thereby form an inexpensive socket that is integral to the printed wiring board yet absent the need for springs, sockets and the associated manufacturing and assembly costs of existing socket apparatus. The present low cost pin retention socket comprises a center hole into which the printed wiring board connector pin is inserted. Surrounding the center hole and intersecting the center hole are a plurality of other holes formed in the printed wiring board to thereby enable a certain amount of plastic deformation of the center hole in response to the insertion therein of a printed wiring board connector pin. The electrical connection between the printed wiring board connector pin and the wiring on the printed wiring board is effected be plating the sides of the center hole to thereby contact the printed wiring board connector pin. Thus, the present low cost pin retention socket requires little manufacturing cost and yet performs the function of the existing backplane electrical sockets.

10 Claims, 1 Drawing Sheet

6,142,794

LOW COST PIN RETENTION SOCKET

FIELD OF THE INVENTION

This invention relates to backplane wiring for printed wiring board carriers and, in particular, to a low cost pin retention socket that functions to provide an interconnection for the pins of the printed wiring board connectors.

PROBLEM

It is a problem in the field of printed wiring board wiring to provide a low cost interconnection apparatus for the pins of a printed wiring board connector. The printed wiring board connectors provide a predetermined pattern of square pins that protrude from the back of the connector body. This predetermined pattern of square pins is typically inserted into a corresponding pattern of plated holes that are formed in the backplane of the printed wiring board carrier to electrically interconnect the printed wiring board connector with wiring that is formed on the backplane printed wiring board. The printed wiring board connector pins are then soldered to the plated holes to provide a mechanical and electrical connection of the printed wiring board connector to the backplane. Alternatively, compliant pins can be used for this purpose and even though there is no permanent connection between the compliant pins and the backplane holes, such an interconnection is of such integrity as to be used as a semi-permanent connection mechanism. However, the use of compliant pins for this purpose is relatively expensive.

In the case where the printed wiring board connector is removably attached to the backplane, electrical sockets are used to interconnect the printed wiring board connector pins to the backplane wiring. In particular, the backplane printed wiring board is equipped with a corresponding pattern of plated holes, into which are inserted sockets which are then soldered to the plated holes. The printed wiring board connector can then be removably attached to the backplane by inserting the predetermined pattern of square pins of the printed wiring board connector into the corresponding predetermined pattern of sockets that are mounted on the backplane. Existing sockets for use with printed wiring board connectors are effective to provide a reliable electrical connection between the pins and the sockets, but are expensive to use for this purpose, since they typically comprise a shell and a spring element mounted therein to mechanically engage the pin and provide reliable electrical interconnection between the pin and the socket. Furthermore, the associated cost of manufacture comprises the cost to machine the holes in the backplane, plate these holes, insert each of the sockets in their respective plated hole, then solder the socket to the plated hole. These multiple steps of the manufacturing process add a significant cost to the implementation of removably attaching a printed wiring board connector to the backplane.

Therefore, there presently are no inexpensive yet reliable solutions to the need for removably attaching a printed wiring board connector to the backplane of a printed wiring board carrier.

SOLUTION

The above described problems are solved and a technical advance achieved by the present low cost pin retention socket which comprises a set of holes that are machined into a printed wiring board and selective surfaces thereof plated to thereby form an inexpensive socket that is integral to the printed wiring board yet absent the need for springs, sockets and the associated manufacturing and assembly costs of existing socket apparatus. The present low cost pin retention socket comprises a center hole into which the printed wiring board connector pin is inserted. Surrounding the center hole and intersecting the center hole are a plurality of other holes formed in the printed wiring board to thereby enable a certain amount of plastic deformation of the center hole in response to the insertion therein of a printed wiring board connector pin. The electrical connection between the printed wiring board connector pin and the wiring on the printed wiring board is effected be plating the sides of the center hole to thereby contact the printed wiring board connector pin. Thus, the present low cost pin retention socket requires little manufacturing cost and yet performs the function of the existing backplane electrical sockets.

DETAILED DESCRIPTION OF THE DRAWING

Figure 1:
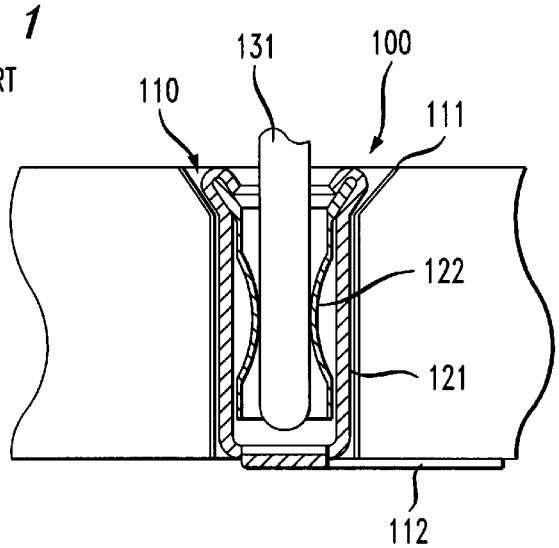
FIG. 1 illustrates in side cross-section view a typical existing backplane electrical socket.

FIG. 1 illustrates in side cross-section view a typical existing backplane electrical socket 100. In particular, the backplane printed wiring board 101 is equipped with a corresponding pattern of plated holes, such as cylindrically shaped hole 110, which is plated with an electrically conductive material 111 to interconnect the backplane wiring 112 with whatever apparatus is inserted into cylindrically shaped hole 110. A socket 100 is inserted into cylindrically shaped hole 110, coming into contact with plating 111 that coats the inside surface of cylindrically shaped hole 110. The socket 100 comprises a cylindrically shaped shell 121 which is sized to correspond to the inside diameter of the cylindrically shaped hole 110 and to which is mechanically and electrically connected a spring 122. The spring 122 is contained within the inside opening of the cylindrically shaped shell 121 and functions to receive the printed wiring board connector pin 131 and provide mechanical and electrical connection between the cylindrically shaped shell 121 and the printed wiring board connector pin 131. The cylindrically shaped shell 121 is soldered to the plating 111 that coats the inside surface of cylindrically shaped hole 110 to establish the electrical connection between the socket 100 and the backplane wiring 112.

The printed wiring board connector can then be removably attached to the backplane by inserting the predetermined pattern of square pins of the printed wiring board connector into the corresponding predetermined pattern of sockets that are mounted on the backplane. Existing sockets for use with printed wiring board connectors are effective to provide a reliable electrical connection between the pins and the sockets, but are expensive to use for this purpose, since they typically comprise a shell and a spring element mounted therein to mechanically engage the pin and provide reliable electrical interconnection between the pin and the socket. Furthermore, the associated cost of manufacture comprises the cost to machine the holes in the backplane, plate these holes, insert each of the sockets in their respective plated hole, then solder the socket to the plated hole. These multiple steps of the manufacturing process add a significant cost to the implementation of removably attaching a printed wiring board connector to the backplane.

Figure 2:
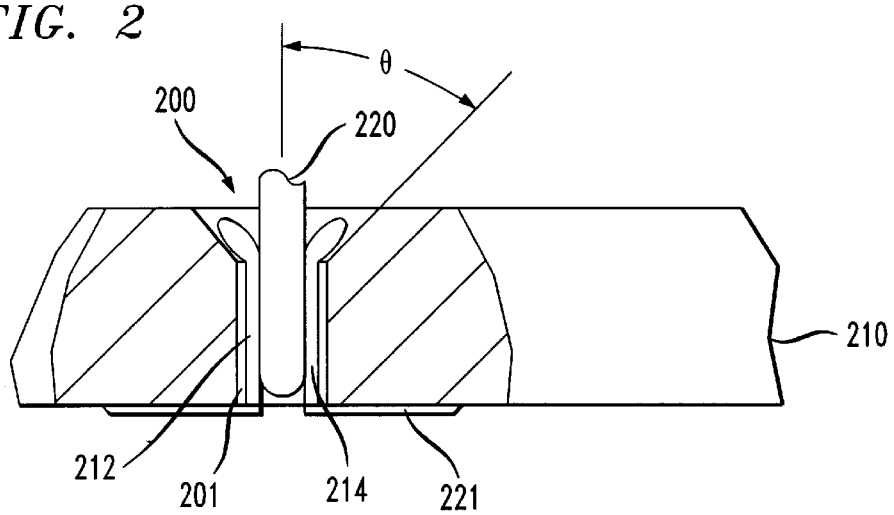
FIGS. 2 and 3 illustrate side cross-section and top plan views of the present low cost pin retention socket.
Figure 3:
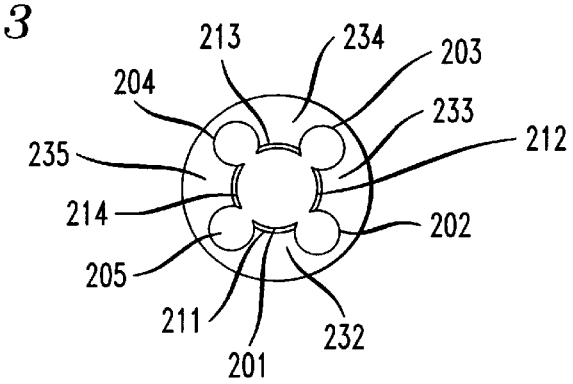

FIGS. 2 and 3 illustrate side cross-section and top plan views of the present low cost pin retention socket 200. The present low cost pin retention socket 200 comprises a set of holes 201–205 that are machined into a printed wiring board 210 and at least selected surfaces 211–214 thereof plated to thereby form an inexpensive socket that is integral to the printed wiring board 210 yet absent the need for springs, sockets and the associated manufacturing and assembly costs of existing socket apparatus. The selected surfaces 211–214 can be exclusively plated by masking the other holes 202–205 to prevent the plating of the interior cylindrical surfaces thereof. However, it is more economical to simply plate the entirety of the exposed interior surfaces of the holes 201–205, with the plating of the selected surfaces 211–214 being of most significance for the implementation of the present low cost pin retention socket 200.

The present low cost pin retention socket 200 comprises a cylindrically shaped center hole 201 of predetermined circumference (and likewise diameter) that extends from a first surface of the printed wiring board 210 to a second surface of the printed wiring board that is parallel to the first surface. The center hole 201 need not extend through the printed wiring board 210, although the present embodiment discloses such a configuration for simplicity of description. The cylindrically shaped center hole 201 is the structure into which the printed wiring board connector pin 220 is inserted. Surrounding the center hole 201 and intersecting the center hole 201 are a plurality of other holes 202–205 formed in the printed wiring board 210 to thereby enable a certain amount of plastic deformation of the center hole 201 in response to the insertion therein of a printed wiring board connector pin 220. The electrical connection between the printed wiring board connector pin 220 and the wiring 221 on the printed wiring board 210 is effected by plating the sides 211–214 of the center hole 201 with an electrically conductive material 215 to thereby contact the printed wiring board connector pin 220. Thus, the present low cost pin retention socket 200 requires little manufacturing cost and yet performs the function of the existing backplane electrical sockets.

In the example illustrated in FIGS. 2 and 3, the surrounding holes 202–205 comprise four cylindrically shaped holes that intersect the center hole 201. The four holes 202–205 are each located around the periphery of the center hole 201 at positions to correspond to edges of the printed wiring board connector pin 220 so that the corners of the printed wiring board connector pin 220 engage the inner surfaces 211–214 of the center hole 201. The land areas 232–235 that result from the selected pattern of holes 201–205 include inner surfaces 211–214 that comprise segments of the circumference of the center hole 201 and provide a deformable structure that plastically deforms in response to the insertion of the printed wiring board connector pin 220 into the center hole 201. While the deflection is primarily plastic, some elasticity remains in the land areas 232–235 and this elasticity maintains a gas tight seal and reliable electrical connection between the printed wiring board connector pin 220 and the plating applied to the inner surfaces 211–214 of the center hole 201. The number of surrounding holes 202–205, the relative size of the surrounding holes 202–205 to the center hole 201, as well as the extent of their intersection can be used to selectively create a predetermined magnitude of plasticity and elasticity in the present low cost pin retention socket 200.

A typical embodiment of the present low cost pin retention socket 200 makes use of four holes 202–205 that are each roughly 50% of the diameter of the center hole 201 and located in an equal spaced relationship around the periphery of the center hole 201, located substantially at the corners of the square printed wiring board connector pin 220. The four surrounding holes 202–205 are typically formed first, then the center hole 201 machined in the center of the pattern of the four holes 202–205. The size of the center hole 201 is typically selected to be slightly larger in diameter than the length of the printed wiring board connector pin 220 is on a side. There are a number of considerations in the selection of the relative sizes of the center hole 201 and surrounding holes 202–205. The cost of drills that are used to machine the holes 201–205 is a function of the size of the hole to be drilled. Very small hole sizes require small diameter drills, which are expensive due to the need to construct them in a manner to have a high strength to diameter ratio. In addition, the use of holes of non-standard or uncommon diameter effects the cost of the drills. The backplane pins 220 tend to be relatively large compared to many connector pins and for these square cross-section pins, the use of use of four holes 202–205 that are each roughly 50% of the diameter of the center hole 201 appears to be a highly desirable configuration.

The center hole 201 can also be chamfered at angle E, as shown only in FIG. 2, to provide a lead-in for the printed wiring board connector pin 220. The plating of the four land areas 232–235 that form the circumference of the center hole 201 (and alternatively the interior surface of the other holes 202–205) is effected in the same manner as the plating of any hole in a printed wiring board.

Thus, the present low cost pin retention socket 200 is a structure that is integral to the printed wiring board 210 and is fabricated with a significant reduction in the material cost and labor required in fabricating and installing the present printed wiring board sockets. The amount of deformation can be regulated by the size, number and magnitude of intersection of the surrounding holes 202–205 with the center hole 201.

What is claimed:

1. A pin retention socket for electrically and mechanically interconnecting a pin to wiring located on a printed wiring board, comprising:

a center hole formed in said printed wiring board of size to receive said pin;

electrically conductive means applied to an inside surface of said center hole and electrically interconnected to wiring located on a printed wiring board; and a plurality of holes formed in said printed wiring board, each intersecting a periphery of said center hole, of shape and dimensions to provide a deformable structure that plastically deforms in response to the insertion of said pin into said center hole.

2. The pin retention socket of claim 1 wherein said plurality of holes are spaced uniformly around said periphery of said center hole.

3. The pin retention socket of claim 1 wherein said plurality of holes comprises four holes, each located around said periphery of said center hole at positions to correspond to edges of said pin.

4. The pin retention socket of claim 1 wherein each of said plurality of holes is sized to have a diameter substantially 50% of the diameter of said center hole.

5. The pin retention socket of claim 1 wherein said plurality of holes each have an axis that is parallel to each other and to the axis of said center hole.

6. A pin retention socket for electrically and mechanically interconnecting a pin to wiring located on a printed wiring board that has first and second parallel oriented opposing surfaces, comprising:

a center cylindrically shaped hole formed in said printed wiring board of circumference to receive said pin and extending from said first surface to said second surface of said printed wiring board;

a plurality of holes formed in said printed wiring board extending from said first surface to said second surface of said printed wiring board, each of said plurality of holes intersecting a periphery of said center cylindrically shaped hole to form a plurality of land areas each of which land areas including a surface that comprises a segment of said circumference of said center cylindrically shaped hole, said land areas being of shape and dimensions to provide a deformable structure that plastically deforms in response to the insertion of said pin into said center hole; and electrically conductive means applied to said surface of said plurality of land areas to comprise a plurality of segments of said circumference of said center cylindrically shaped hole said electrically conductive means being electrically interconnected to wiring located on a printed wiring board.

7. The pin retention socket of claim 6 wherein said plurality of holes are spaced uniformly around said periphery of said center cylindrically shaped hole.

8. The pin retention socket of claim 6 wherein said plurality of holes comprises four holes, each located around said periphery of said center cylindrically shaped hole at positions to correspond to edges of said pin.

9. The pin retention socket of claim 6 wherein each of said plurality of holes is sized to have a diameter substantially 50% of the diameter of said center cylindrically shaped hole.

10. The pin retention socket of claim 6 wherein said plurality of holes each have an axis that is parallel to each other and to the axis of said center cylindrically shaped hole.

* * * * *